(12) United States Patent
Harris

(10) Patent No.: US 8,958,510 B1
(45) Date of Patent: Feb. 17, 2015

(54) SELECTABLE BANDWIDTH FILTER

(76) Inventor: Fredric J. Harris, Spring Valley, CA (US)

( * ) Notice: Subject to any disclaimer, the term of this patent is extended or adjusted under 35 U.S.C. 154(b) by 0 days.

(21) Appl. No.: 13/158,275

(22) Filed: Jun. 10, 2011

Related U.S. Application Data

(60) Provisional application No. 61/353,600, filed on Jun. 10, 2010, provisional application No. 61/374,268, filed on Aug. 17, 2010.

(51) Int. Cl.
*H04B 1/10* (2006.01)

(52) U.S. Cl.
USPC .......................................... 375/350; 375/346

(58) Field of Classification Search
USPC .................. 375/350, 229, 260, 346, 348–349
See application file for complete search history.

(56) References Cited

U.S. PATENT DOCUMENTS

| | | | | |
|---|---|---|---|---|
| 4,799,179 A * | 1/1989 | Masson et al. | ................ | 708/313 |
| 4,852,166 A * | 7/1989 | Masson | ........................... | 380/36 |
| 4,959,863 A * | 9/1990 | Azuma et al. | ................. | 704/272 |
| 5,867,479 A * | 2/1999 | Butash | .......................... | 370/210 |
| 6,005,900 A * | 12/1999 | Zangi | .......................... | 375/350 |
| 6,091,704 A * | 7/2000 | Butash | .......................... | 370/210 |
| 6,351,451 B1 * | 2/2002 | Butash | .......................... | 370/210 |
| 6,456,657 B1 * | 9/2002 | Yeap et al. | ................. | 375/240.12 |
| 6,493,358 B1 * | 12/2002 | Soleymani | .................... | 370/480 |
| 6,590,871 B1 * | 7/2003 | Adachi | .......................... | 370/307 |
| 6,792,057 B2 * | 9/2004 | Kabel et al. | ................... | 375/346 |
| 6,947,509 B1 * | 9/2005 | Wong | ........................... | 375/350 |
| 7,072,412 B1 * | 7/2006 | Bellanger et al. | ............. | 375/261 |
| 7,145,972 B2 * | 12/2006 | Kumar et al. | ................. | 375/349 |
| 7,372,907 B2 * | 5/2008 | Munoz et al. | ................. | 375/260 |
| 7,430,254 B1 * | 9/2008 | Anderson | ...................... | 375/342 |
| 8,045,654 B1 * | 10/2011 | Anderson | ...................... | 375/342 |
| 2001/0036152 A1 * | 11/2001 | Butash | .......................... | 370/210 |
| 2002/0056135 A1 * | 5/2002 | Sharma | .......................... | 725/126 |
| 2004/0042557 A1 * | 3/2004 | Kabel et al. | ................... | 375/260 |
| 2007/0047683 A1 * | 3/2007 | Okamura et al. | ............. | 375/355 |
| 2007/0067376 A1 * | 3/2007 | Noga | ............................. | 708/300 |
| 2008/0222228 A1 * | 9/2008 | Halle | ............................ | 708/300 |
| 2009/0198753 A1 * | 8/2009 | Benjelloun Touimi | ........ | 708/313 |
| 2011/0106211 A1 * | 5/2011 | Litvak | .............................. | 607/57 |
| 2011/0110473 A1 * | 5/2011 | Keehr et al. | ................... | 375/350 |
| 2012/0065983 A1 * | 3/2012 | Ekstrand et al. | .............. | 704/500 |
| 2012/0163615 A1 * | 6/2012 | Li et al. | ......................... | 381/71.1 |
| 2013/0090933 A1 * | 4/2013 | Villemoes et al. | ............ | 704/500 |

OTHER PUBLICATIONS

Fredric J. Harris, "Multirate Signal Processing for Communication Systems," Jun. 2005, pp. 1-478; Prentice Hall PTR, Upper Saddle River, New Jersey 07458.

\* cited by examiner

*Primary Examiner* — Emmanuel Bayard

(74) *Attorney, Agent, or Firm* — Law Office of Glenn R. Smith; Glenn R. Smith; Lisa L. Smith

(57) ABSTRACT

A pair of M-path perfect reconstruction filter banks, one for analysis and one for synthesis avoid aliasing of channel filter band-edges by operating at an output sample rate of 2-samples per channel bandwidth. The non-maximally decimated analysis filter performs an M/2-to-1 down sample operation to obtain the 2-samples per channel output rate. The corresponding synthesis bank accepts signal samples at 2-samples per symbol and up-samples 1-to-M/2 to obtain the original and desired output sample rate matched to the input sample rate. Changes in composite system bandwidth are achieved by enabling or disabling the connection between the analysis filter bank and the corresponding synthesis filter bank.

4 Claims, 19 Drawing Sheets

SELECTABLE BANDWIDTH FILTER

PRIORITY CLAIM TO RELATED PROVISIONAL APPLICATIONS

The present application claims priority benefit under 35 U.S.C. §119(e) to U.S. Provisional Patent Application Ser. No. 61/353,600 filed Jun. 10, 2010, titled Multichannel Filter Bank with Multiple Channel Bandwidths; and to U.S. Provisional Patent Application Ser. No. 61/374,268 filed Aug. 17, 2010, titled Selectable Bandwidth Filter; the above-cited provisional patent applications are both hereby incorporated by reference herein.

BACKGROUND OF THE INVENTION

A multichannel digital receiver simultaneously down-converts a set of frequency division multiplexed (FDM) channels residing in a single sampled data signal stream. In a similar way, a multichannel digital transmitter simultaneously up-converts a number of baseband signals to assemble a set of FDM channels in a single sampled data signal stream. The polyphase filter bank has become the architecture of choice to efficiently accomplish these tasks. This architecture uses three interacting processes to assemble or to disassemble the channelized signal set. In a receiver these processes are an input commutator to effect spectral folding or aliasing due to a reduction in sample rate, a polyphase M-path filter to time align the partitioned and resampled time series in each path, and a discrete Fourier transform to phase align and separate the multiple base-band aliases. In a transmitter, these same processes operate in a related manner to alias baseband signals to high order Nyquist zones while increasing the sample rate with the output commutator. As such, multichannel wireless digital receivers and transmitters are defined by the relationships between channel bandwidth, channel separation and channel sample rate.

SUMMARY OF THE INVENTION

A multichannel digital up-converter channelizer or digital down-converter channelizer may comprise an M-point DFT, an M-path polyphase filter, and an M-point commutator. In such a channelizer, the FFT is responsible for partitioning the spectral span contained in the sampling rate interval $f_S$ into M-channels that are equally spaced at $f_S/M$. The prototype filter embedded in the polyphase partition is responsible for forming the equal width channel filters centered on the frequency centers of the DFT. Further, the M-port commutator is responsible for the M-to-1 or 1-to-M resampling that occurs in the digital down-converter and the digital up-converter respectively. The most common form of an M-path channelizer performs M-to-1 down-sampling of an input series by delivering M-successive input samples to the input ports of an M-path partitioned low-pass filter. Each output port of the M-path filter contains an aliased time signal caused by the input down-sampling. In a channelizer embodiment, the aliases are the M-to-1 spectral folds of the Nyquist zones formerly centered on the M-multiples of the output sample rate.

The alias components in each path have different and unique phase profiles partly due to the time delays induced by the commutator process and partly due to the phase shift response of each path in the M-path filter. When phase rotators matching the k-th multiple of the M-roots of unity are applied to the output time series from each path, the phases of the aliased k-th Nyquist zone in each path filter are aligned. When the phase aligned alias terms are added they form a coherent sum of that spectral component. On the other hand, the phase profiles of the remaining Nyquist zones are aligned with the M-roots of unity and are destructively canceled when summed. Intuitively, the extraction of the time series from any selected aliased Nyquist zone is possible because the time series from each path supplies one of the M-equations required to solve for the M-unknowns, the aliased components from the M Nyquist zones.

One aspect of a versatile bandwidth channelizer has a FDM input signal, an initial channelizer that forms M, fs/M wide channels and a multi-level spectral partition output. In an embodiment, a post processing channel selector is in communications with the initial channelizer channels and generates the multi-level partition output. In various embodiments, the initial channelizer comprises a two-pronged commutator that inputs the FDM signal, an M-path polyphase filter in communications with the commutator, a circular buffer in communications with the polyphase filter and a M-point IFFT generating the channels. At least one of the channel selector outputs feeds an up-sampler. At least one of the channel selector outputs feeds a down-sampler. The up-sampler comprises a sub-M point IFFT input, a sub-M path polyphase filter output and a circular buffer in communications between the IFFT and polyphase filter.

Further, there are many applications for digital filters that require operator selectable bandwidths over a wide range of fractional bandwidth. Implementation considerations favor filters with fixed coefficients that are implemented with hardwired multipliers rather than with arbitrary multipliers. In an embodiment, only fixed, hardwired multipliers are used to form a pair of M-path analysis and synthesis filters. A selectable bandwidth filter is advantageously formed by enabling or disabling the connections between the output ports of the analysis filter and the input ports of the synthesis filter.

DETAILED DESCRIPTION OF THE PREFERRED EMBODIMENTS

Figure 1:
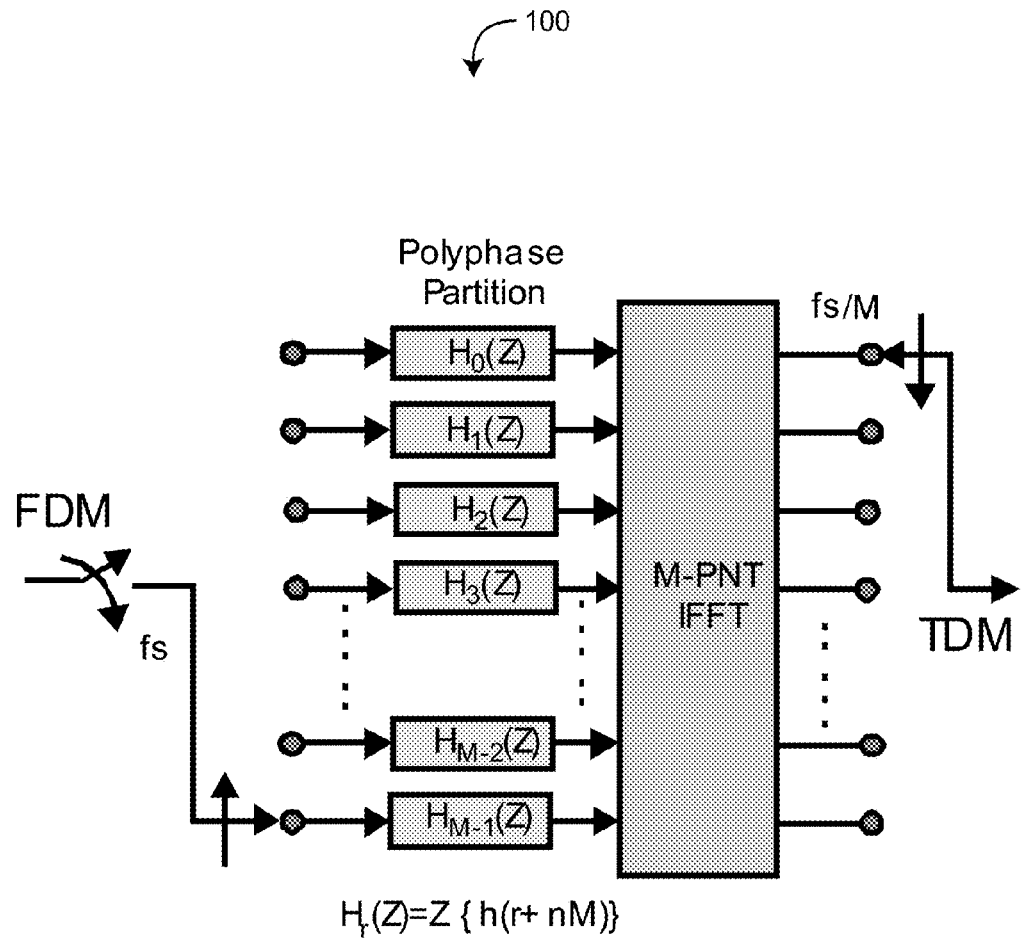
FIG. 1 is a block diagram of an M-to-1 down sample, M-path polyphase channelizer.

FIG. 1 illustrates an M-to-1 down sample, M-path polyphase channelizer 100. When the time signals residing in multiple aliased Nyquist zones are to be separated from the M-fold aliased baseband signal, the collection of phase rotators and coherent sums is most efficiently applied to the output of the M-path filter by the inverse fast Fourier transform (IFFT), as shown in this structure of an M-path down-sampler and channelizer. The M-path polyphase channelizer performs three distinct tasks, and these tasks occur in different segments of the channelizer. The first task is the selection of the number of Nyquist zones to be separated by the channelizer. Here the number of zones or channels is defined by M, the size of the IFFT. The M in the M-point transform defines both the width of the successive Nyquist zones and the spacing between channel spectral centers as $f_S/M$, where $f_S$ is the input sample rate. The second task is the definition of the channelizer spectral response, which includes pass-band and stop-band boundaries as well as pass-band and stop-band ripple. The channel spectra match the aliased spectrum of the prototype low-pass from which the M-path filter was partitioned. The third task is that of resampling from the input sample rate of $f_S$ to the output channel sample rate of $f_S/M$. This process occurs in the commutator, which delivers M input samples to the polyphase system for it to compute 1 output sample from each channel. Because three different processes are responsible for the channelizer parameters of channel spacing, channel bandwidth, and channel sample rate, these can be independently selected and adjusted to obtain useful variations of the channelizer.

FIGS. 2A-D illustrate a set of options for selecting and controlling channel spacing, channel bandwidth and channel sample rate parameters. This set does not exhaust the list of possible options. In the four cases shown, the channel spacing is the same and equal to $f_S/M$. Accordingly, the IFFT is of length M and the filter is likely an M-path filter. The channel bandwidth of the first option is less than the channel spacing. The channel bandwidth of the second option is equal to the channel spacing. The filter bandwidth is controlled and defined in the design of the low pass prototype filter that is partitioned to become the M-path structure. The first filter option would likely be selected for a communication receiver that needs to separate adjacent spectral bands. The second filter option would likely be selected for a spectrum analyzer that must monitor and report the energy content in contiguous gap free spectral intervals. In these first two options 201, 202, the sample is shown to be $f_S/M$ telling us that this is a maximally decimated filter bank with M input samples for 1 output sample.

Figure 2A:
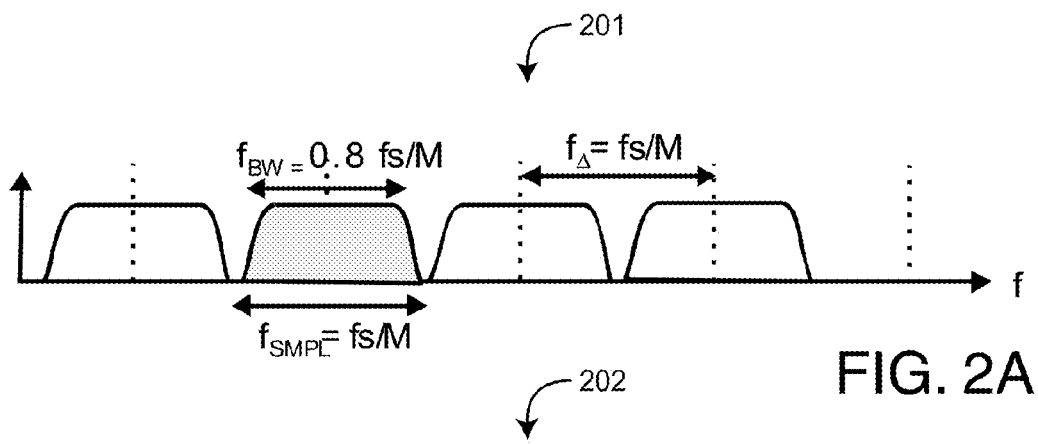
FIGS. 2A-D are magnitude versus frequency graphs relating some channelizer parameters to channel spacing, channel bandwidth and channel sample rate.
Figure 2B:
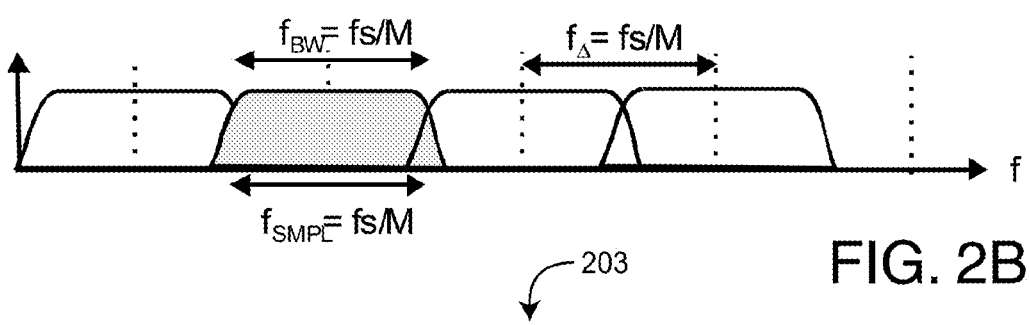
Figure 2C:
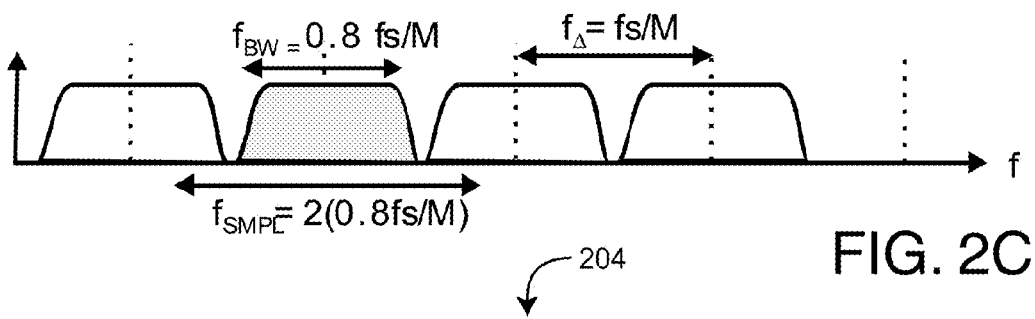
Figure 2D:
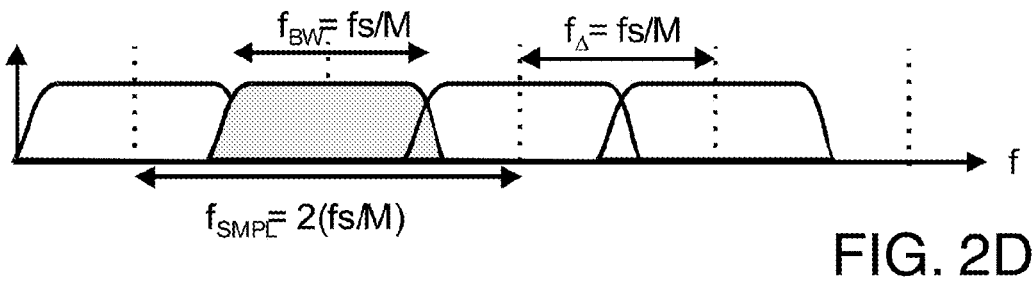

As shown in FIGS. 2C-D, the third and fourth options 203, 204 match the channel spacing and channel bandwidths of the first two options but differ in output sample rates. In the third option, the output sample rate is equal to twice the channel symbol rate, which is a rate greater than the channel spacing. This option is desired for communication receivers that perform the synchronization and equalization tasks required for signal demodulation at 2-samples per symbol.

Figures 3A, 3B:
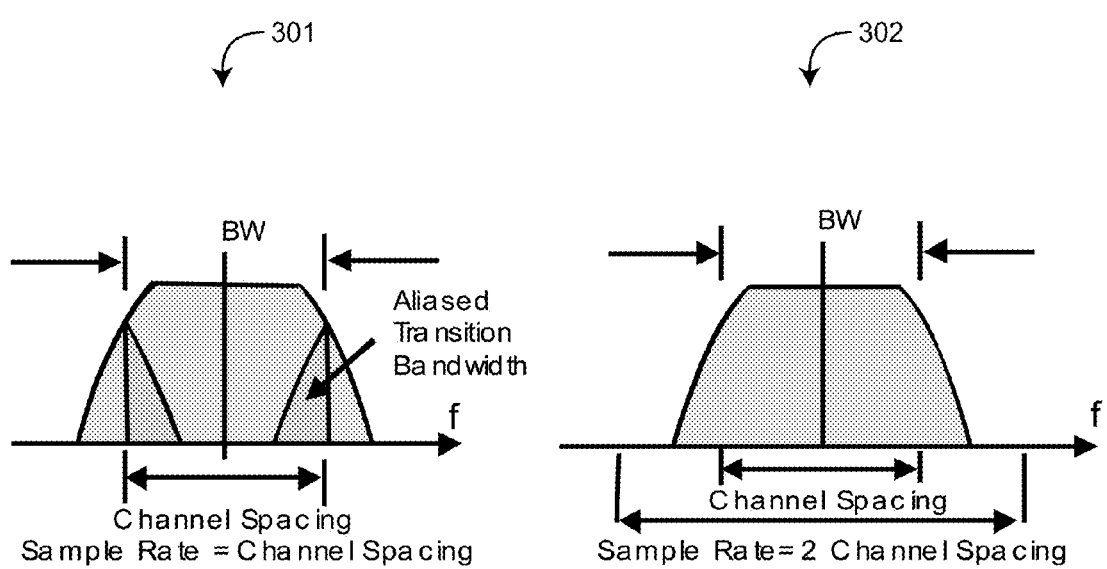
FIGS. 3A-B are magnitude versus frequency graphs illustrating channel spectral folding when the sample rate equals the channel spacing and no spectral folding when the sample rate equals to twice the channel spacing.

FIGS. 3A-B illustrates the desired property of the fourth option. In the fourth option, the output sample rate is twice the channel spacing. The advantage of this option is two-fold. First, it satisfies the Nyquist sampling criteria of the channelized signals for signal bandwidths less than or equal to the channel spacing. Second, it avoids the spectral folding 301 at the channel band edge for channel widths equal to the channel spacing.

Figure 4A:
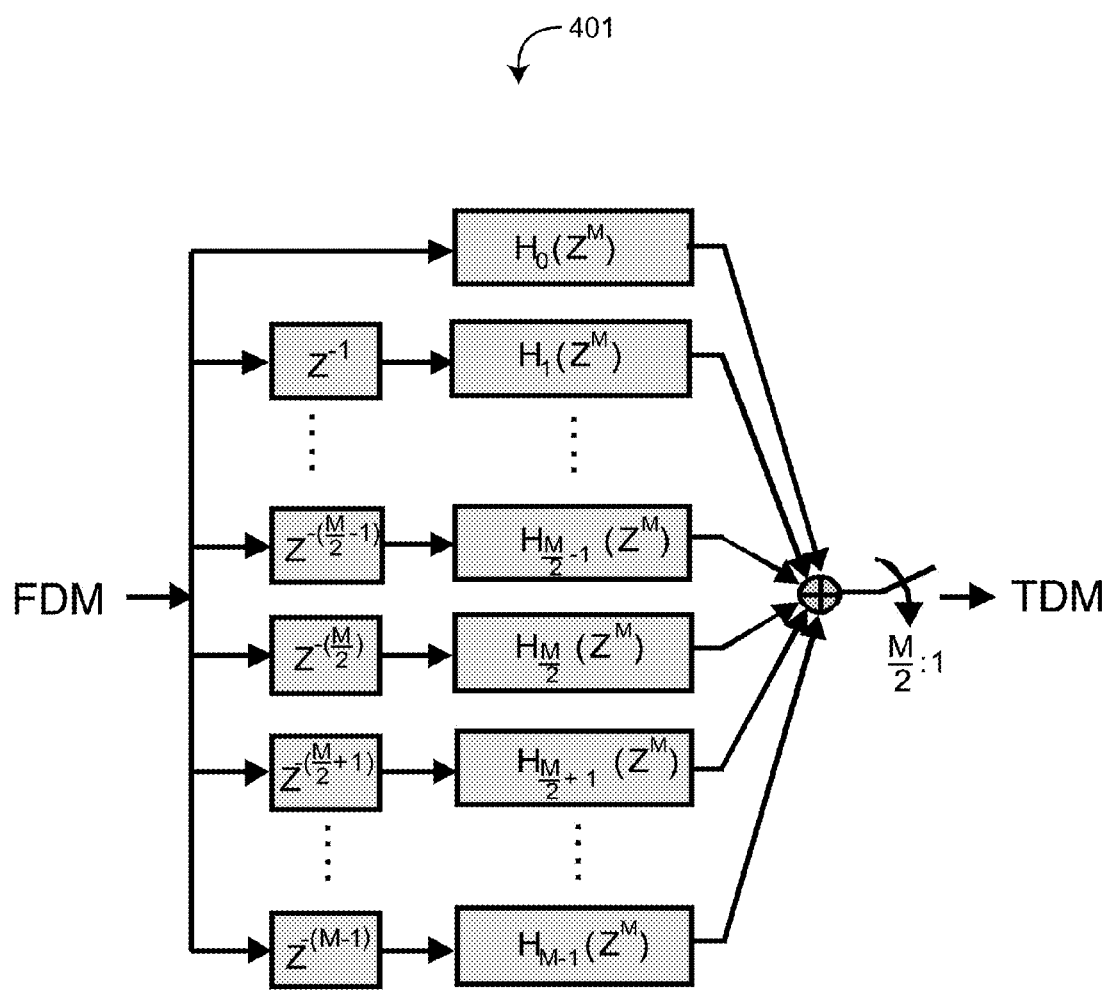
FIG. 4A is a block diagram illustrating a M-Path filter and a M/2 down-sample.

FIGS. 4A-D illustrate a modification of the M-path polyphase filter to perform a sample rate change from the input rate $f_S$ to the output rate $2f_S/M$. FIG. 4A presents the structure of the M-path filter 401 implementation of the polyphase partition shown in EQ. 1 for the specific M-path filter partition. Note the M/2-to-1 rather than the conventional M-to-1 down-sample operation after the output summing junction.

$$H(Z) = \sum_{n=0}^{N-1} h(n)Z^{-n} \quad \text{(EQ. 1)}$$

$$= \sum_{r=0}^{M-1} \sum_{n=0}^{(N/M)-1} h(r+nM)Z^{-(r+nM)}$$

$$= \sum_{r=0}^{M-1} Z^{-r} \sum_{n=0}^{(N/M)-1} h(r+nM)Z^{-nM}$$

$$= \sum_{r=0}^{M-1} Z^{-r} H_r(Z^M)$$

where $$H_r(Z^M) = \sum_{n=0}^{(N/M)-1} h(r+nM)Z^{-nM}$$

Figure 4B:
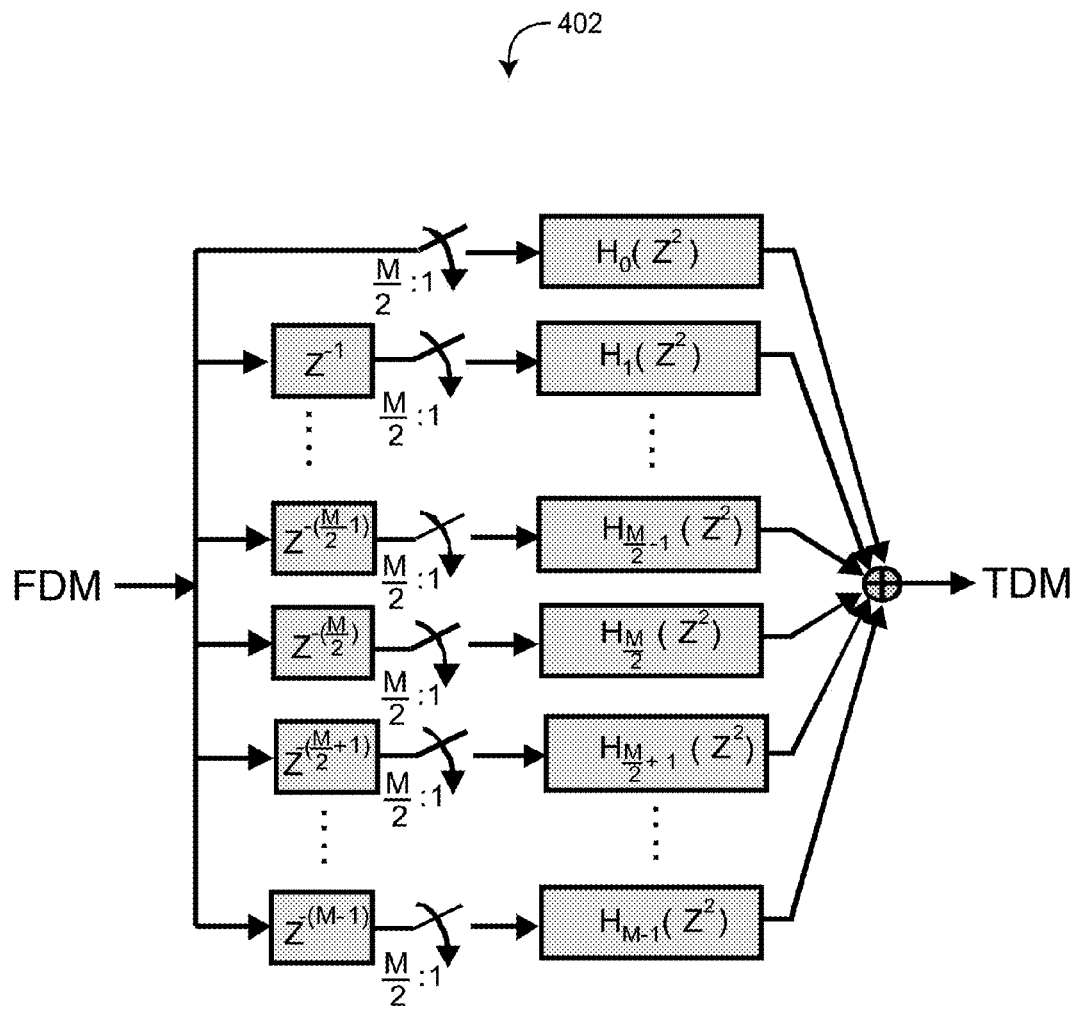
FIG. 4B is a block diagram illustrating the down sampling noble identity applied to path filters.
Figure 4C:
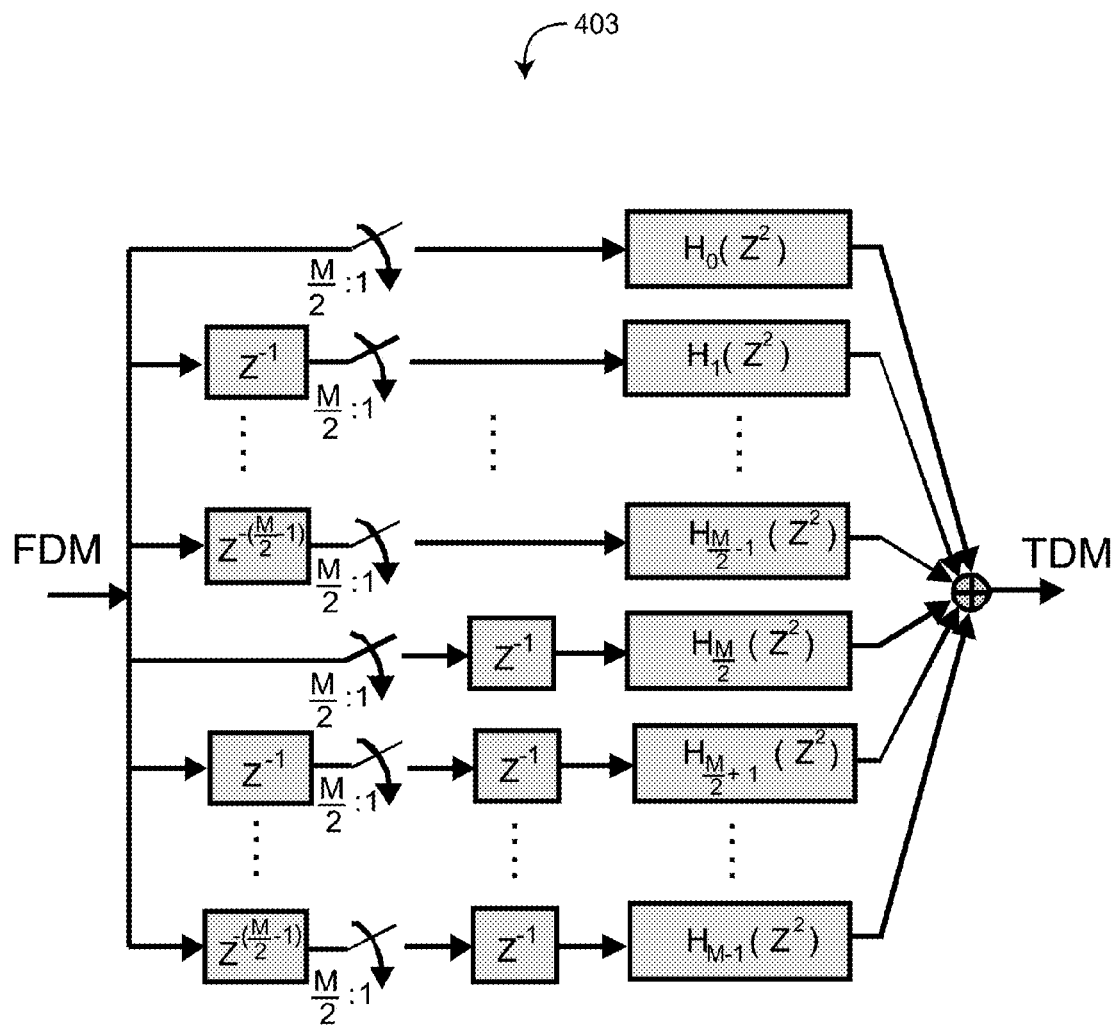
FIG. 4C is a block diagram illustrating the down sampling noble identity applied to path delays.
Figure 4D:
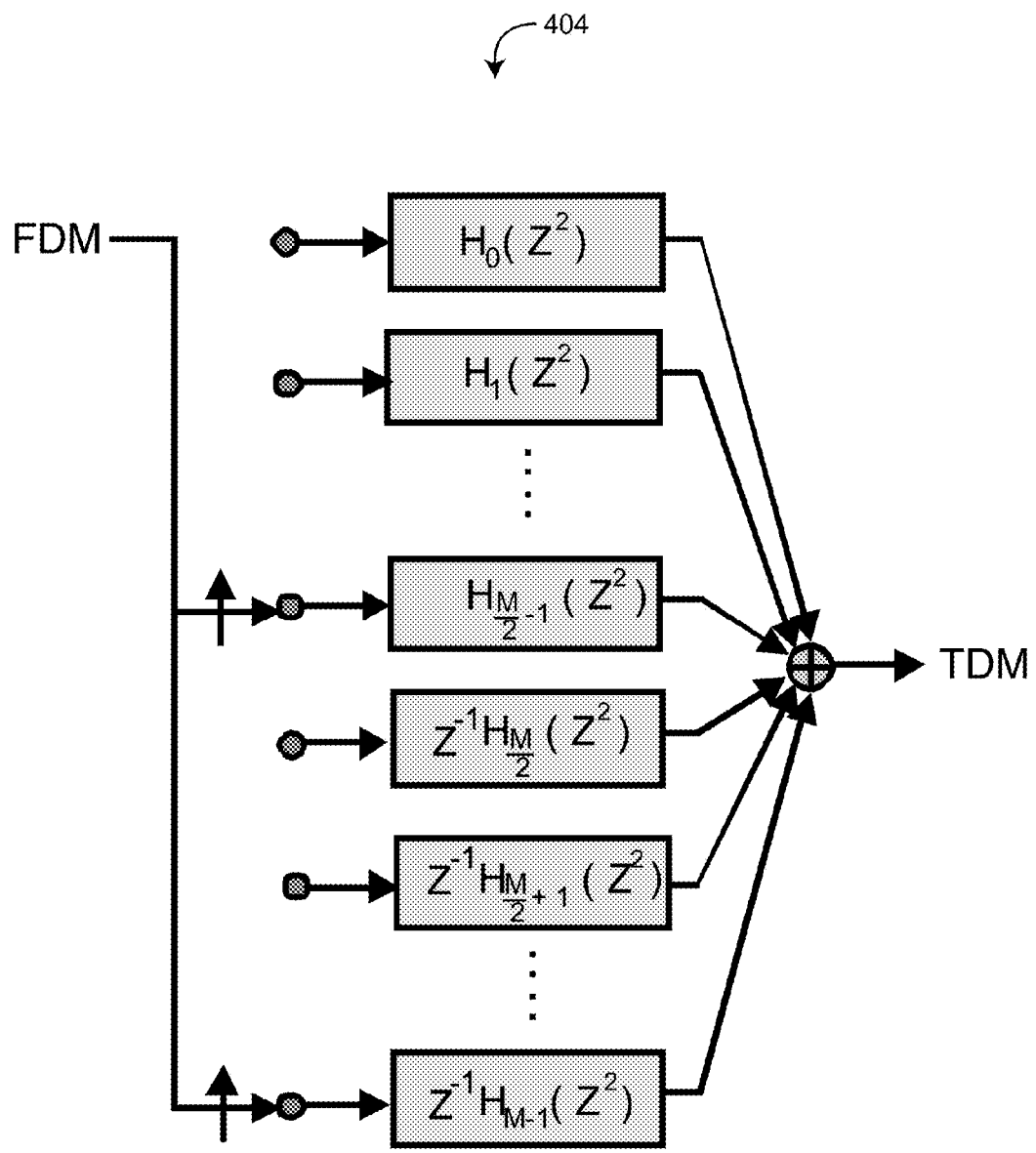
FIG. 4D is a block diagram illustrating a commutator replacing path delays.
Figure 5:
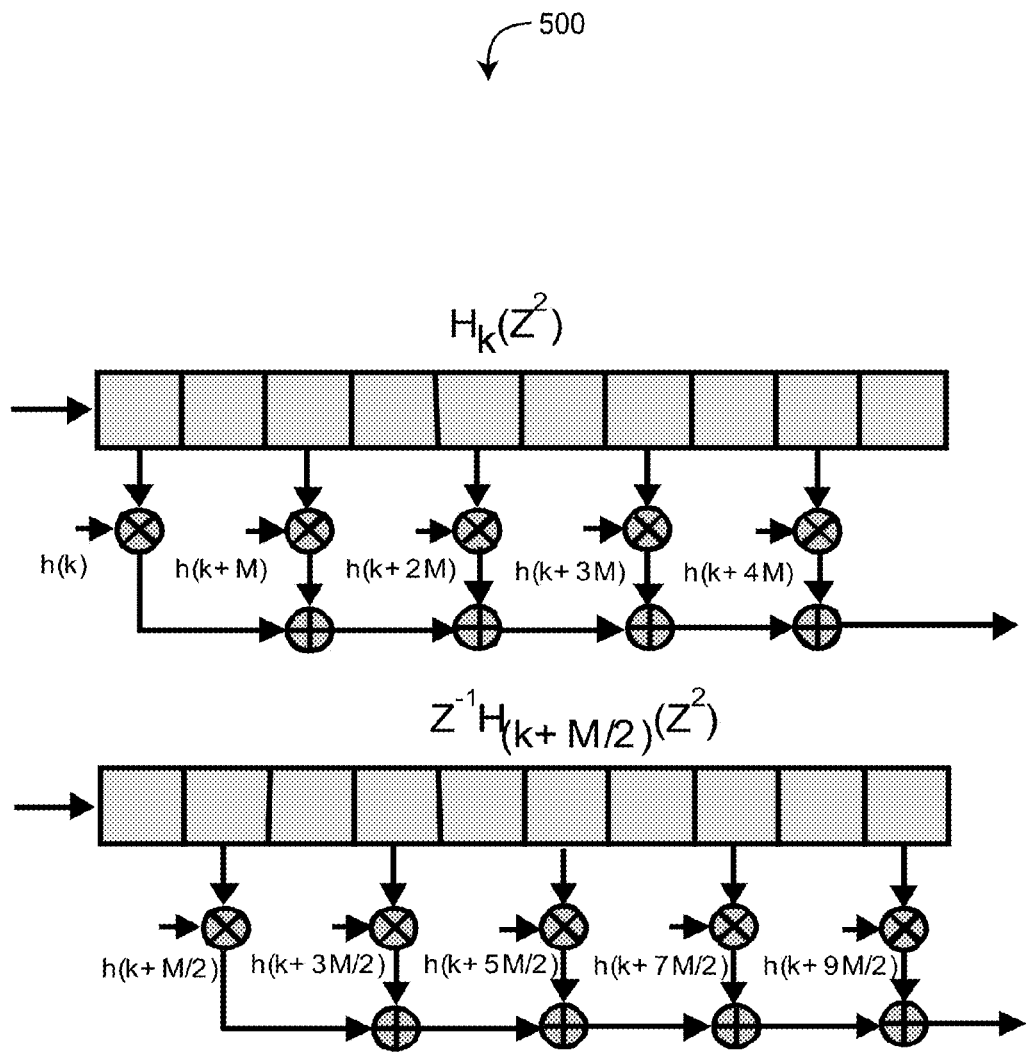
FIG. 5 is a block diagram illustrating path filters with and without extra delay.

FIG. 4B illustrates the application of the down sampling noble identity to the polyphase paths 402. This pulls the M/2-to-1 down-sampler through the path filters, which converts the polynomials in $Z^M$ operating at the high input rate to polynomials in $Z^2$ operating at the lower output rate. Note the paths are now polynomials in $Z^2$ rather than polynomials in Z as is the normal mode in the maximally decimated filter bank. FIG. 4C illustrates the second application of the noble identity 403 in which the M/2-to-1 down-sampler is again taken through the $Z^{-M/2}$ parts of the input path delays for the paths in the second or bottom half of the path set. FIG. 4D shows the M/2-to-1 down-sampling switches and their delays replaced with a two pronged commutator 404 that delivers the same sample values to the path inputs with the same path delay. The $Z^{-1}$ delays are also merged in the lower half of filter bank with their path filters. FIG. 5 illustrates path filters in the upper and lower half of a modified polyphase partition 500.

Figure 6:
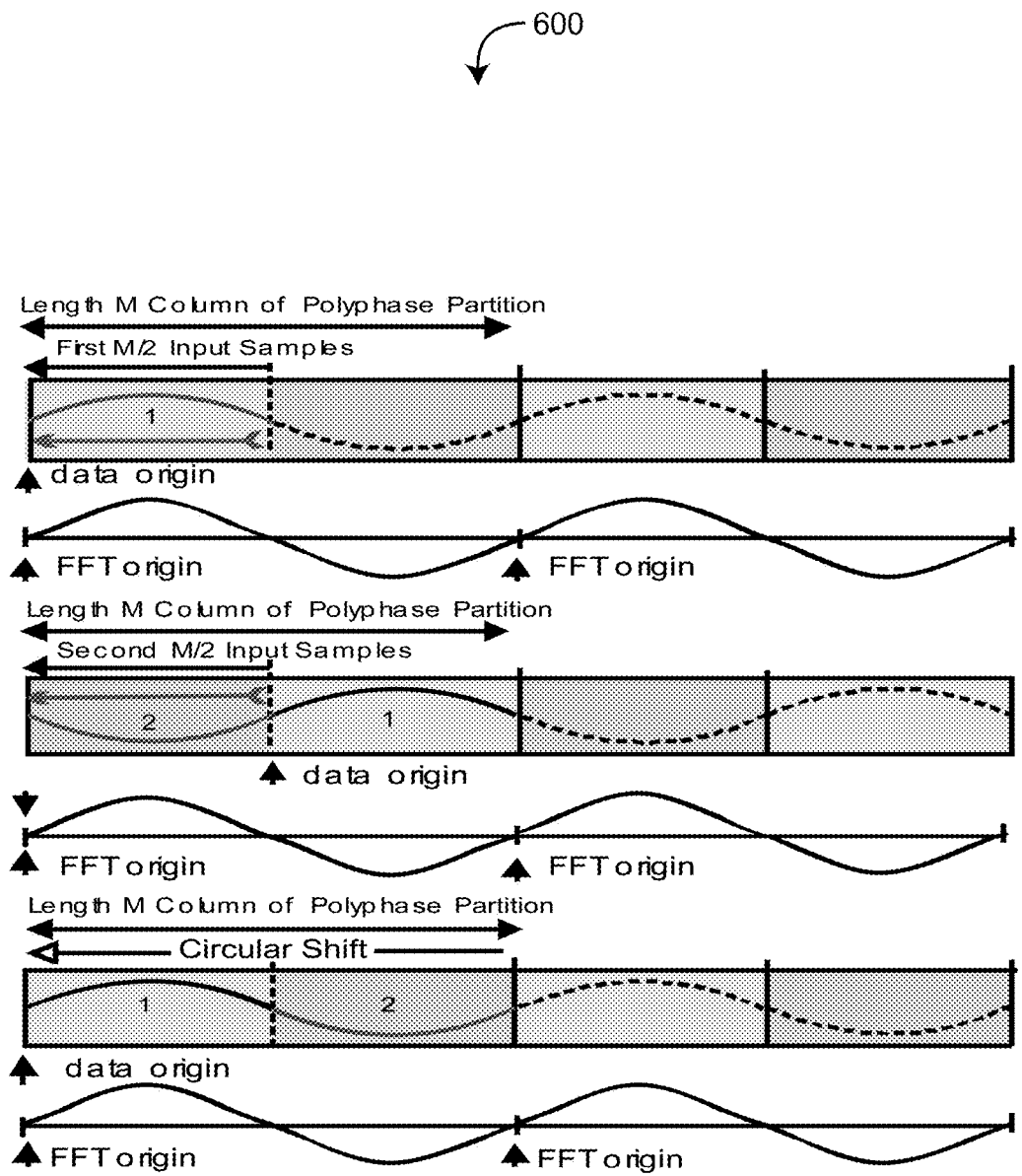
FIG. 6 are amplitude versus time graphs illustrating phase reversal of a M-point sinusoid input to a M/2 path-polyphase filter.

FIG. 6 illustrates the final modification to the polyphase channelizer, which is the time alignment of the shifting time origin of the input samples in the M-path filter with the stationary time origin of the phase rotator outputs of the IFFT. The problem is visualized as a single cycle of a sine wave extending over M samples inserted in the input data register, the first column of the polyphase filter, in segments of length M/2 600. The data in the first M/2 addresses is assumed to be phase aligned with the first M/2 samples of a single cycle of the sine wave offered by the IFFT. When the second M/2 input samples are delivered to the input data register, the first M/2 input samples shift to the second half of the M-length array. Its original origin is now at address M/2, but the IFFT's origin still resides at address 0. The origin shift between the two sine waves causes the input sine wave in the register to have the opposing phase of the sine wave formed by the IFFT. The sinusoids with an odd number of cycles in the length M array alias to the half sample rate when down sampled M/2-to-1. Accordingly, the odd indexed IFFT sinusoids are phase reversed on alternate outputs. Alternatively, knowing that phase shift and time delay are equivalent for a sine wave, M/2 point circular shifts of alternate M-length vectors formed by the polyphase filter are performed before presenting the vector to the IFFT. See *Digital Receivers and Transmitters Using Polyphase Filter Banks for Wireless Communications*; by Fredric J Harris, Chris Dick and Michael Rice; IEEE Transactions On Microwave Theory and Techniques, Vol. 51, No. 4, April 2003, pages 1395-1412, incorporated by reference herein.

Figure 7:
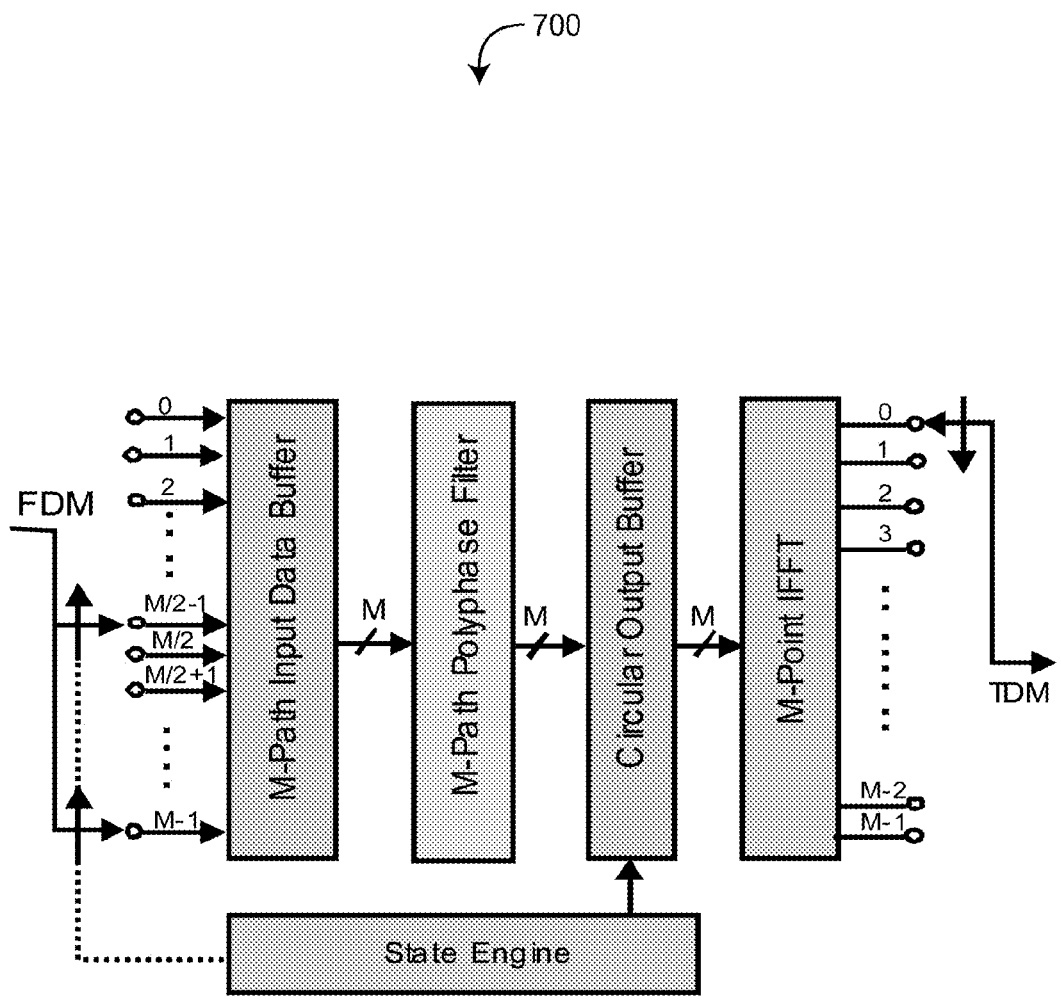
FIG. 7 is a block diagram of a M/2 down-sampled M-path polyphase channelizer.

FIG. 7 illustrates the circular shifts that perform the required phase reversals of successive input vectors presented to the IFFT 700. A 128 path polyphase channelizer with a prototype 1536 tap low pass filter was designed and simulated. The partitioned 128 path filter contains 12 taps per path. The 128-path filter operates as a 64-to-1 down sampling channelizer. Hypothesizing a 128 MHz input sample rate, the channel spacing of the channelizer is 1 MHz and the sample rate per channel is 2 MHz. The prototype filter is designed so that adjacent channel filters cross at their −6 db level. This means the filter is a Nyquist filter and broader bandwidth channels can be synthesized by simple summations of the adjacent channel signal components, as described below.

Figure 8:
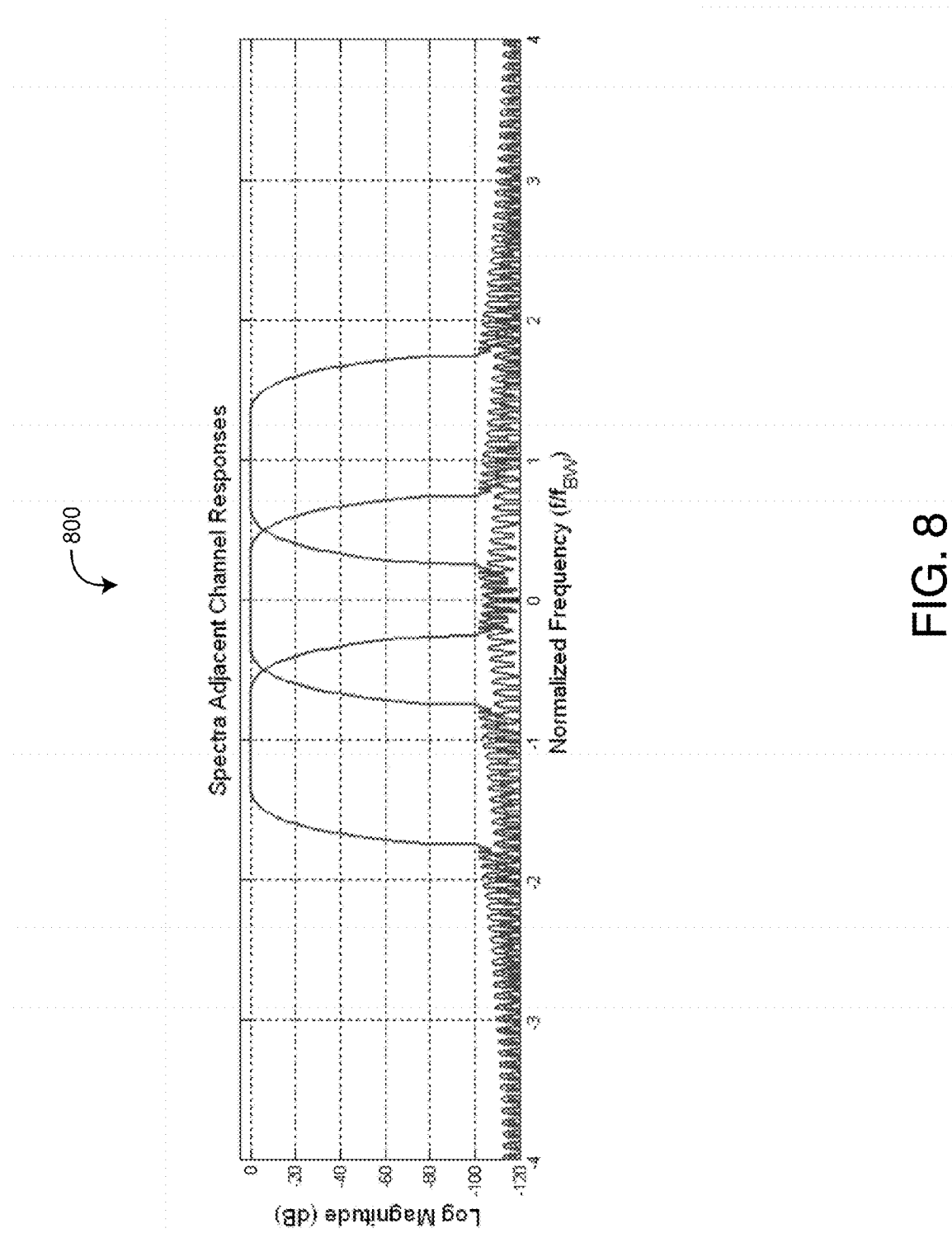
FIG. 8 is a frequency response graph of three adjacent channel bands.

FIG. 8 illustrates the frequency response of the channels in the channelized receiver 800. Note the 100 dB dynamic range of the filter design. To demonstrate the channelizer performance a modulator that forms multiple signal channels with 4-MHz channel spacing was designed and simulated. Twelve of its sixteen channels contain QPSK signals with 2 MHz symbol rates and 3-MHz bandwidths. One channel contains a narrow band QPSK signal with a 0.5 MHz symbol rate and a 1-MHz bandwidth. One set of three channel bands shares a wideband QPSK signal with a 8-MHz symbol rate and a 12 MHz bandwidth.

Figure 9:
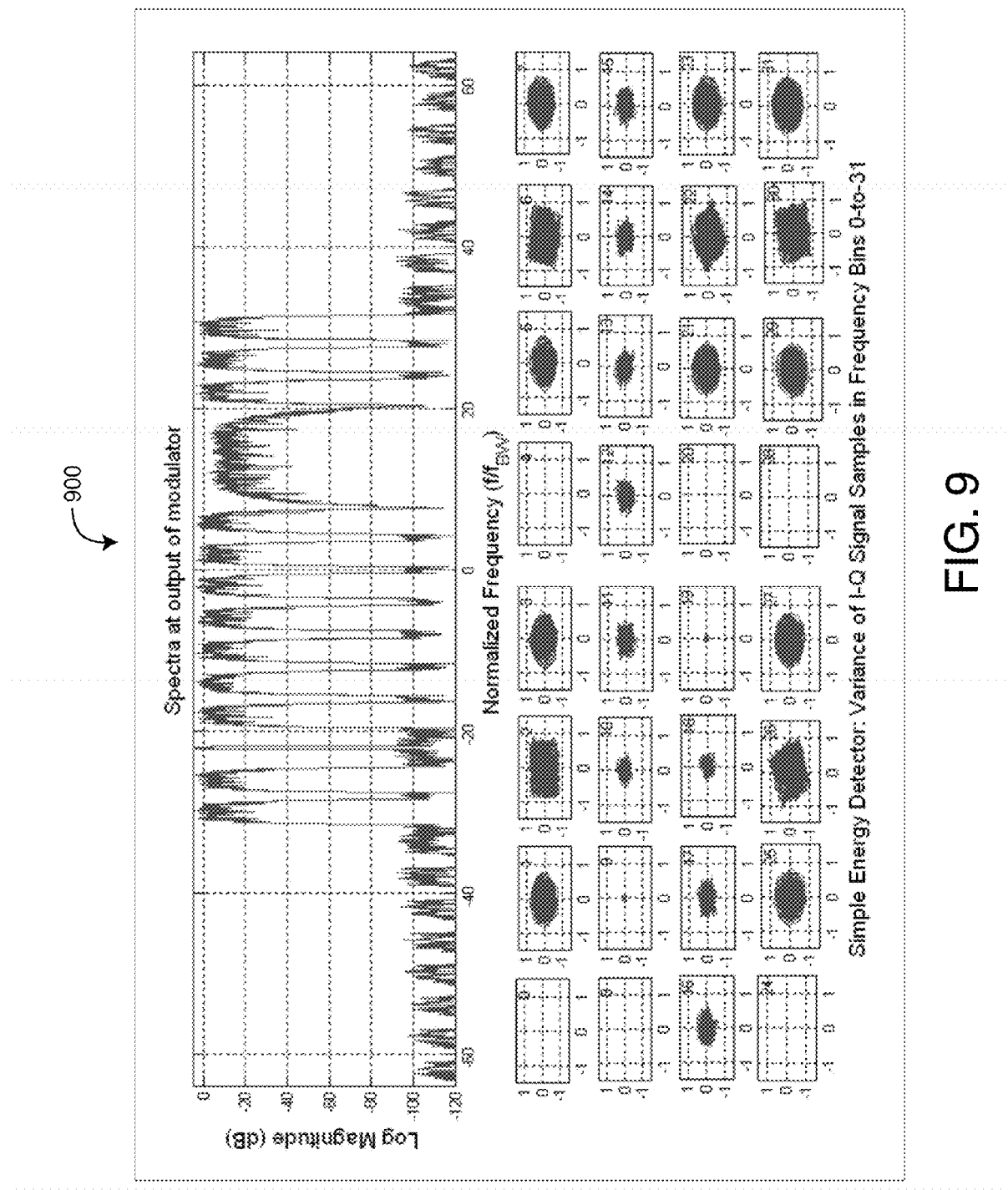
FIG. 9 is an input spectrum graph and charts of a channel complex output signal from 32 positive index channels of a 128 channel channelizer.

FIG. 9 illustrates the spectrum of the modulation test signal in the upper half and the complex signal trajectories from the positive frequency indices 0-to-31 of the 128 channel channelizer in the lower half 900. The variance or spread of these trajectories is proportional to the energy content in that channelized channel. Note that channels 1, 2, and 3 cover the 2-MHz band centered at 1 MHz and channels 9 through 19 cover the 12-MHz band centered at 14 MHz. A plot of signal variance versus channel index is a valid representation of the input signal power spectrum.

Figure 10:
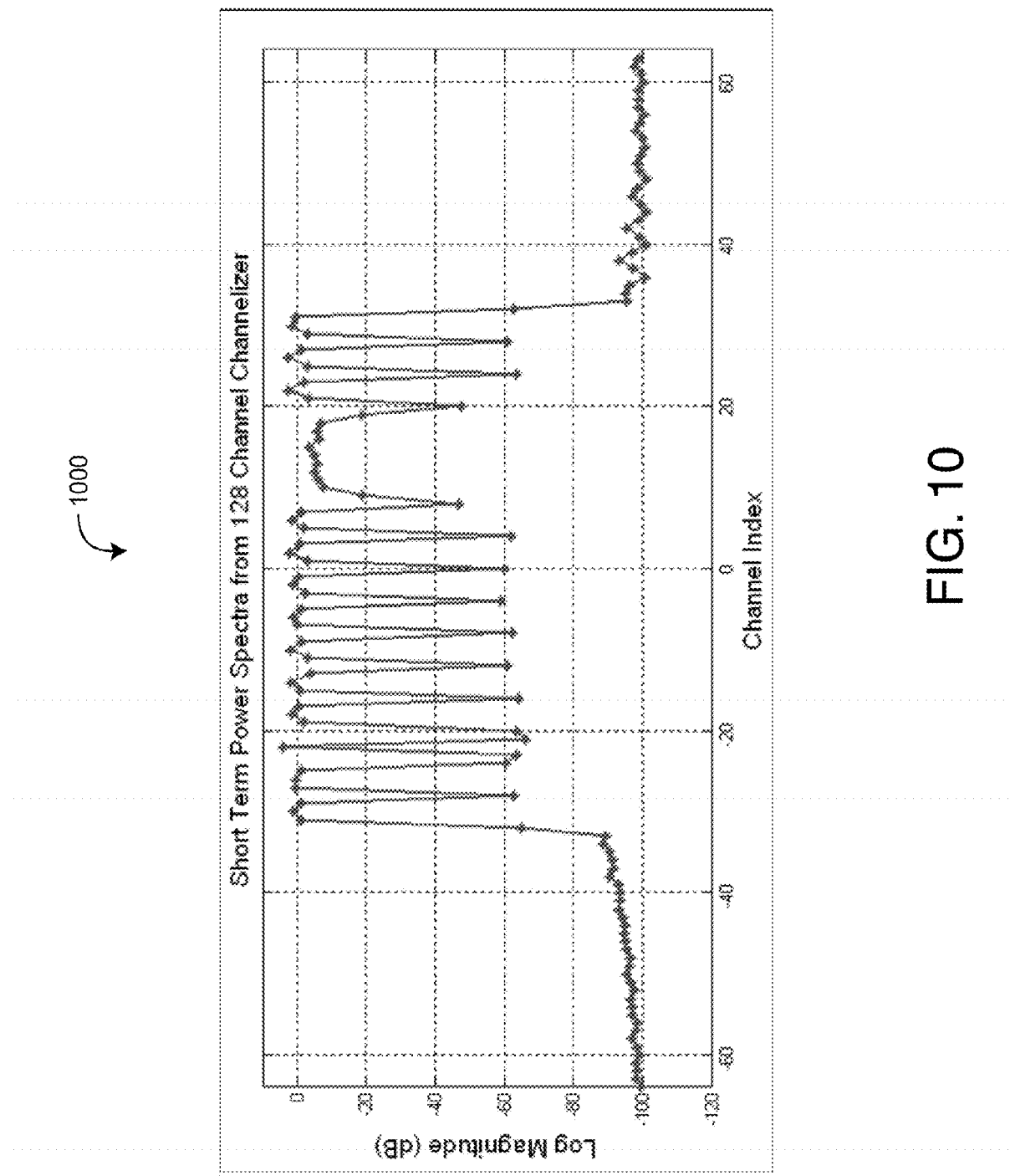
FIG. 10 is a log magnitude plot of a channel time series variance versus channel index.

FIG. 10 illustrates the signal variance of each channel versus channel index 1000. Note from the markers on this plot that the signal bandwidth of the 2-MHz bands are spanned by 3-channel bands while the 1-Mhz signal band is spanned by a single channel filter and the 12 MHz signal band is spanned by 11 channel bands. The channelizer presented above outputs complex time series from 1-MHz wide channels at a 2-MHz sample rate. If a finer resolution channel portioning is needed, the complex time series simply can be delivered to a second tier channelizer, which can further partition the selected band. The second tier channelizer is a replica of the first tier channelizer. It is implemented as an $M_2$-path polyphase filter with an IFFT of length $M_2$, which interacts to channelize and down sample $M_2$-to-1. As an example, selecting $M_2$ to be 16 will process the 1-MHz bandwidth channel signal sampled at 2-MHz to form 62.5 kHz sub channels at 125 kHz sample rates.

There is easy access to enhanced resolution channelization of any of the time series formed by the base-banded, filtered and down-sampled time series obtained from the first tier channelizer. In an embodiment, a second tier channelizer can cover each output channel of the first spectral partition so as to partition the entire spectrum into higher resolution channels. In another embodiment, a background spectral sniffer can identify channels containing signals of interest and direct a second tier channelizer to partition selected channels.

Figure 11:
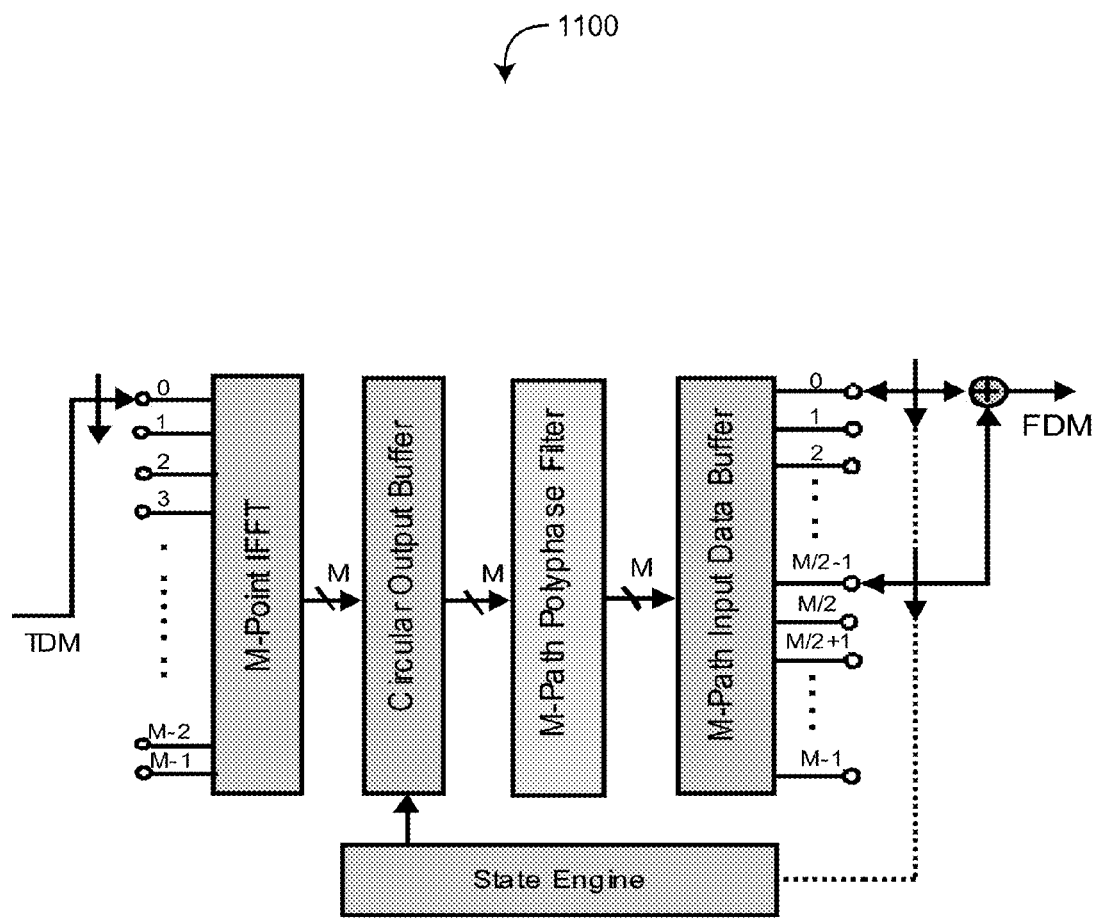
FIG. 11 is a block diagram of a channel combiner that synthesizes wide BW channels.
Figure 12:
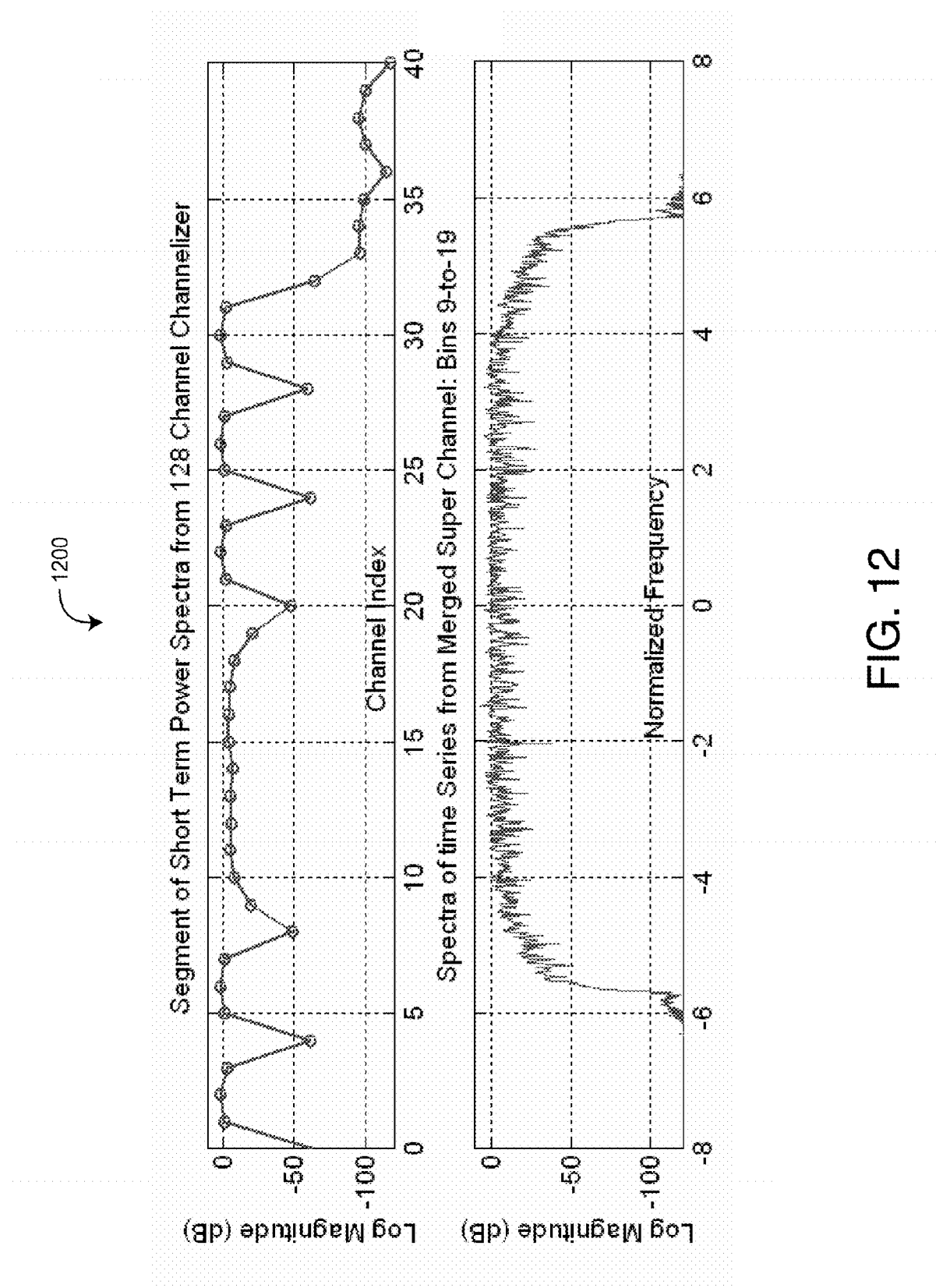
FIG. 12 is a graph of the spectrum formed from a channelizer and a synthesized super channel.

FIG. 11 illustrates a dual channelizer or combiner embodiment 1100. As described above, the signals presented to the channelizer had bandwidths which were wider than the channelizer filter bandwidth. The task of partitioning a selected band into narrower bands was addressed above. The dual task of combining the outputs of contiguous narrowband channels to synthesize wider bandwidths is addressed below. The background sniffer or the spectral estimate obtained from the first tier channelizer can easily identify wide bandwidth input signals, which are spanned by a number of the narrow bandwidth channelizer bands. All the time series from the identified bands have been down-sampled and translated to base-band by the channelizing process. To reassemble the original wider bandwidth signal requires an up-sampling of each time series, a translation of each spectral region to its proper offset frequency and then simply add their signal components. This is the dual operation of the analysis receiver channelizer and this dual task is performed by the dual synthesis channelizer. The dual channelizer, formed by an $M_3$ point IFFT and an $M_3$ path polyphase filter performs an $M_3/2$-to-1 up-sampling function as it combines the time series from selected adjacent bands output from the first tier channelizer. FIG. 12 illustrates the spectrum obtained from the time series output 1200 by the super channel formed from the first tier filter bins 9-to-19.

Figure 13:
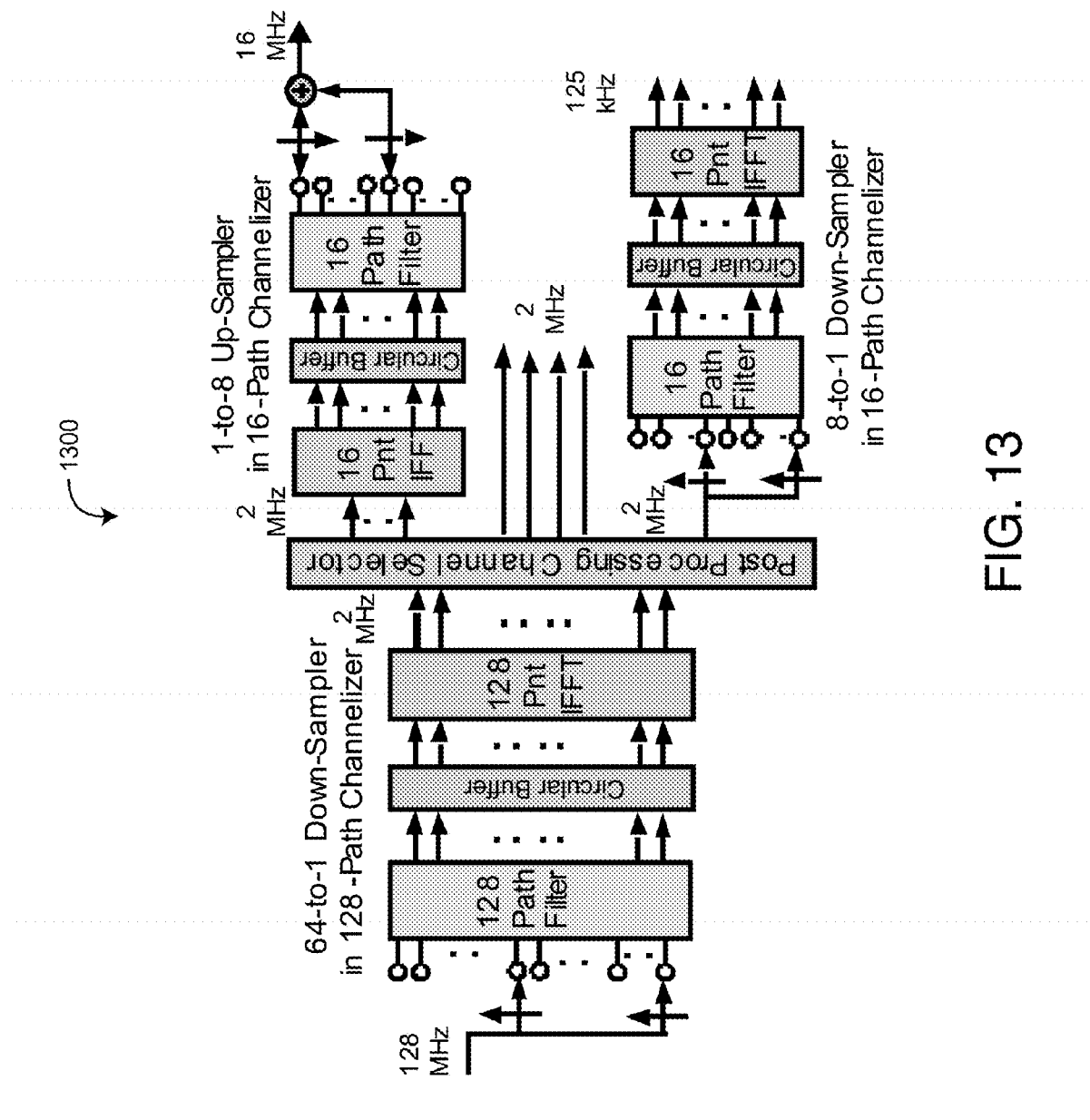
FIG. 13 is a block diagram of a two tier channelizer with a second tier channel combiners and channel partitions.

FIG. 13 illustrates the block diagram of a two tier channelizer 1300. The first tier is the 128 path initial channelizer that forms multiple 1-MHz wide channels sampled at 2.0 MHz. The second tier offers the option of further spectral partition or of spectral merging with 16-path polyphase channelizers. As shown, the system is capable of offering three different levels of spectral partition. These second tier processing blocks can be assigned dynamically to spectral regions that require the additional partitioning or merging. A number of different length second tier channelizers can be used to widen the range of available bandwidths.

There are two conflicting requirements on the design of a digital FIR filter. On one hand there is a need for a digital filter that can switch rapidly between selectable filter bandwidths without the time delay required to upload new sets of filter coefficients. On the other hand, power considerations favor the design of filters with fixed coefficients that allow the multipliers to be implemented as hardwired logic rather than as full Booth arbitrary multipliers. The resolution of these conflicting requirements is the filter structure described here. The technique implements a pair of M-path perfect reconstruction filter banks, one for analysis and one for synthesis. The banks avoid aliasing of channel filter band-edges by operating at an output sample rate of 2-samples per channel bandwidth. This non-maximally decimated analysis filter performs an M/2-to-1 down sample operation to obtain the 2-samples per channel output rate. The corresponding synthesis bank accepts signal samples at 2-samples per symbol and up-samples 1-to-M/2 to obtain the original and desired output sample rate matched to the input sample rate. Changes in composite system bandwidth are achieved by enabling or disabling the connection between the analysis filter bank and the corresponding synthesis filter bank.

Figure 14:
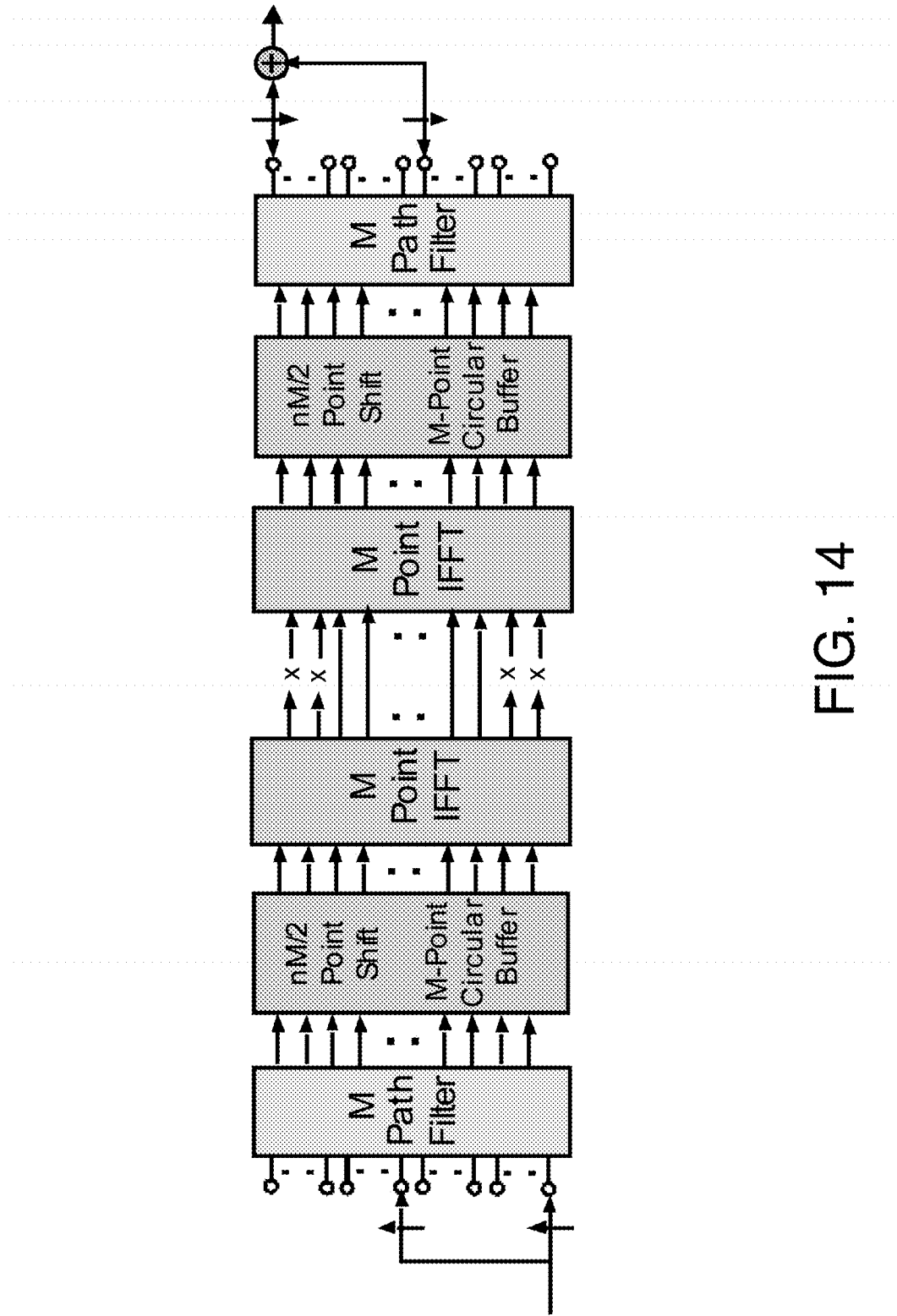
FIG. 14 is a block diagram of cascade polyphase filter analysis and synthesis filter banks satisfying Nyquist rate per channel by operating at two samples per channel width, which avoids spectral aliasing of channel transition bands.

FIG. 14 illustrates an analysis-synthesis selectable bandwidth filter. In this structure, the M-path polyphase filter arms are variants of the standard polyphase partition. The filter in the r-th row in the upper half of the partition are the polynomials $H_r(Z^2)$ and those in the corresponding lower half are the polynomials $Z^{-1}H_{(r+M/2)}(Z^2)$. The input commutator delivers M/2 inputs to both the upper and lower half of the polyphase partition while the output commutator accepts and sums M/2 outputs from the upper and lower halves of the same partitioned filter. The polynomials $H_r(Z^2)$ and the delayed $Z^{-1}H_{(r+M/2)}(Z^2)$ in the upper and lower halves respectively permit the current M/2 sample values from the top half of the filter to interact with the previous M/2 sample values from the lower half of the filter. That time offset between the upper and lower half of the filter is responsible for a frequency dependent phase shift between successive time shifts. This phase offset is removed by the successive shifts of the M/2 circular buffer between the polyphase filter and the IFFT.

The designed system uses a 120 path filter and a 120 point IFFT for the two channelizers. The system is designed to operate at a 12 MHz input sample rate, and presents 120 channels separated by 100 kHz intervals. The available selectable bandwidth, controlled by the spectral resolution of the channelizer, is any multiple of 100 kHz.

Figure 15:
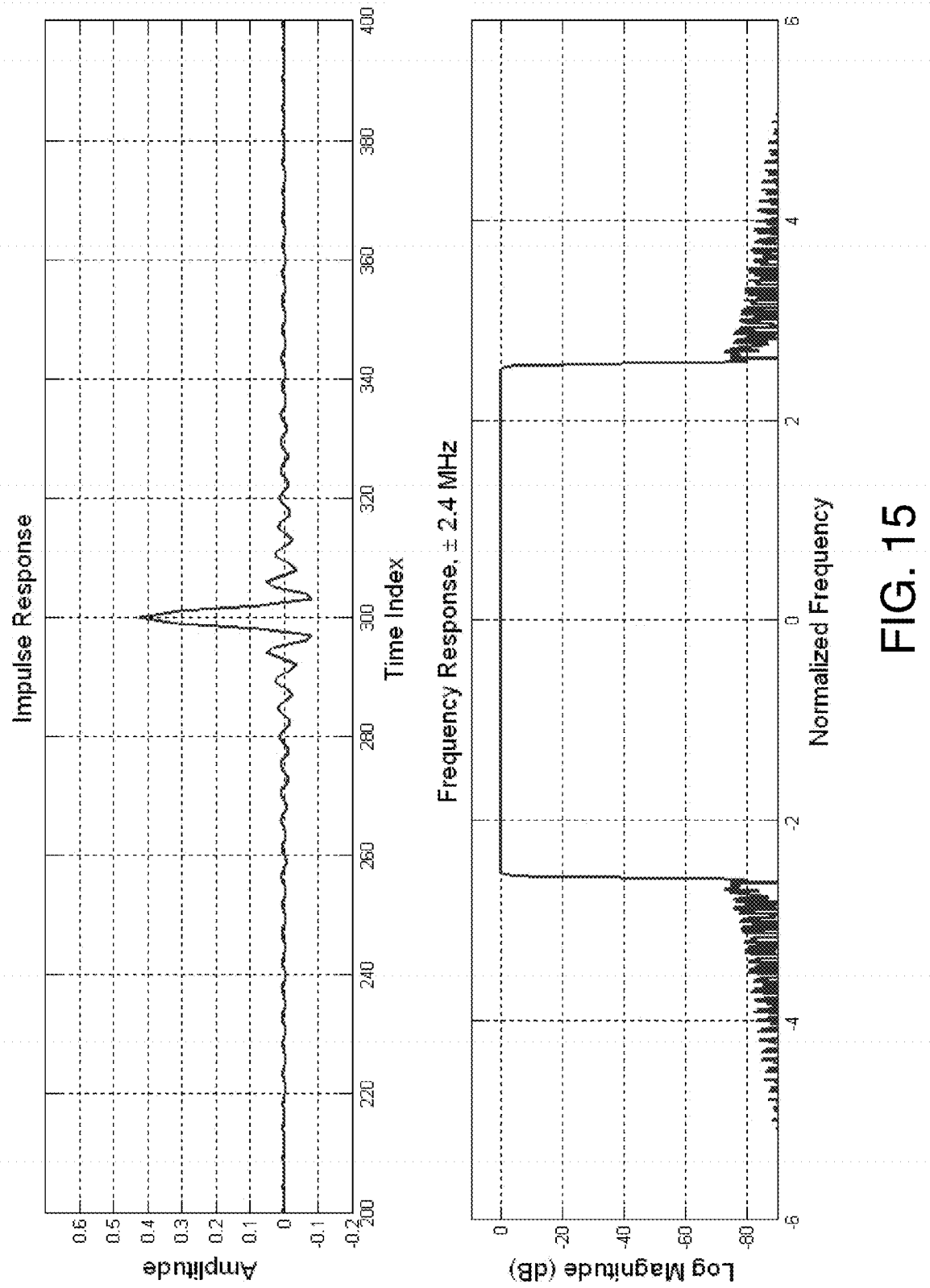
FIG. 15 are graphs of impulse and frequency response for a 120-Path±4 MHz bandwidth polyphase filter.
Figure 16:
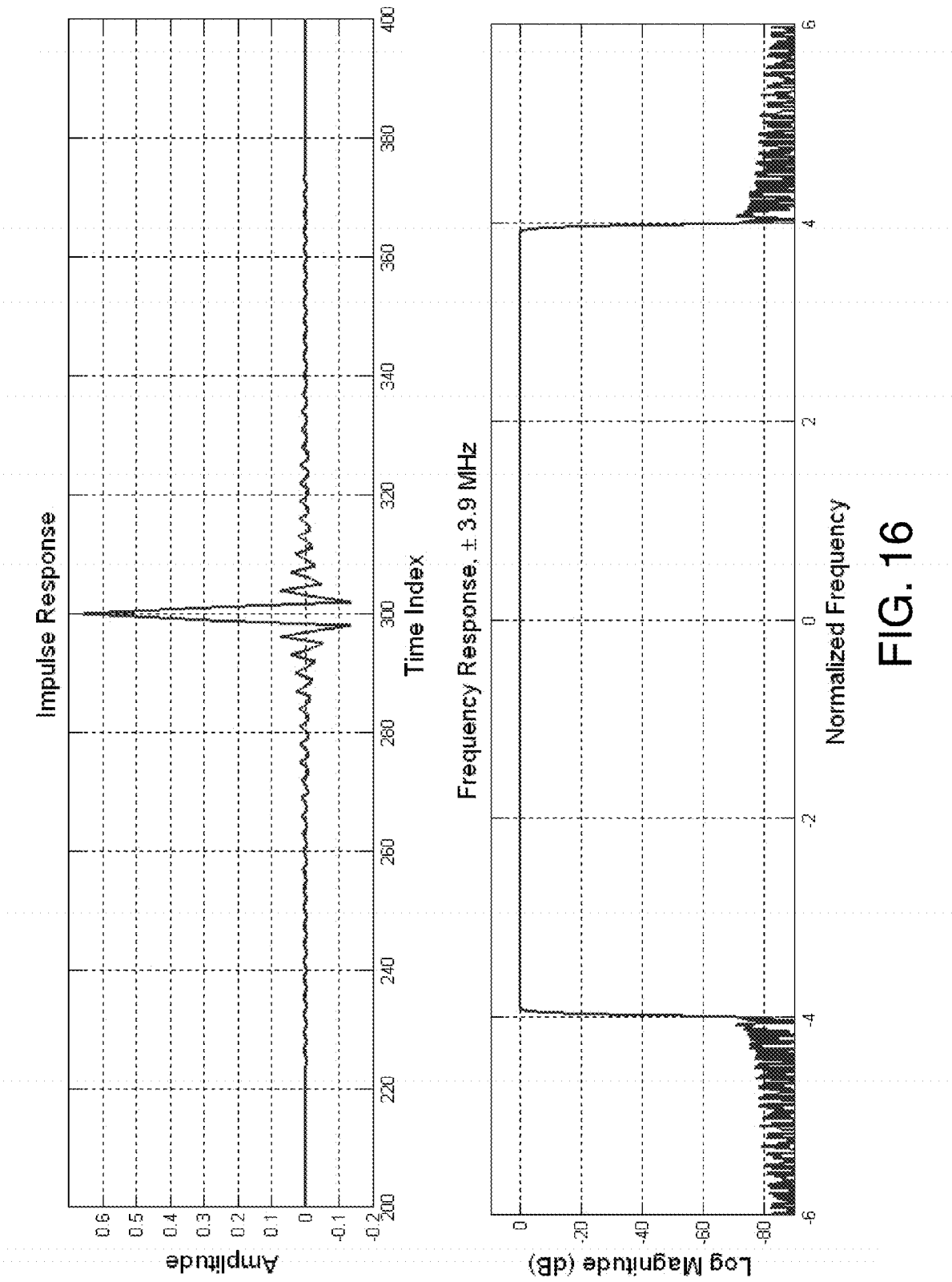
FIG. 16 are graphs of impulse and frequency response for a 120-Path±3.9 MHz Bandwidth Polyphase Filter.

FIG. 15 and FIG. 16 show the Impulse response and frequency response of the 120 path filter with enabled cross over components that form 2.4 MHz and 3.9 MHz filter bandwidths, respectively. Interestingly, the 120 point IFFT can be implemented as a prime factor transform with factors 3, 5, and 8. These can be implemented by the Winograd FFT algorithms with 4, 10, and 4 real multiplies respectively for a total of approximately 480 real multiplies for a complex transform. The polyphase filter bank has 120 filters with 5-coefficients each. The computational workload for the total filter system operating on baseband complex input samples is 10-multiplies per complex input path in the polyphase filter or 20 multiplies for the two path commutator. Amortizing the 480 multiplies in the complex 120 point IFFT over the 120 inputs we have 24 real multiplies per complex input sample. In the analyzer, these numbers can be doubled to account for both the input and output processing. The entire filter only requires 48 real multiplies per input-output complex sample pair. Advantageously, this is equivalent to 24 real multiplies for each of the real and imaginary components of the input time series. In view of the filter frequency response, this filter may be implemented as a single tapped delay line FIR filter with only 24 multiplies per input sample. If this system is implemented at a 12 MHz sample rate in a general purpose processor or in a field programmable gate array, the multiply rate of 576 MHz is low enough that 1-to-3 real multipliers could service the entire filter chain. In is notable that this variable BW filter does not change any coefficients but rather accomplishes the BW change with a masking vector containing zeros and ones between the input and output IFFT's.

A selectable bandwidth filter has been disclosed in detail in connection with various embodiments. These embodiments are disclosed by way of examples only and are not to limit the scope of this disclosure. One of ordinary skill in art will appreciate many variations and modifications.

What is claimed is:

1. A selectable bandwidth filter comprising:
    an analysis filter bank in communications with an input signal having an input sample rate fs;
    the analysis filter bank has M paths and performs an M/2-to-1 down sample so as to generate M channels each having a 2fs/M output sample rate; and
    a channel selector in communications with the M channels so as to provide at least one of selection, partition and merger on at least one of the M channels.

2. The selectable bandwidth filter according to claim 1 further comprising:
    a synthesis filter bank in communications with the channel selector so as to input at least an $M_2$ channel portion of the M channels;
    the synthesis filter bank has $M_2$ paths and performs a 1-to-$M_2$/2 up sample so as to merge the $M_2$ channel portion into an output signal having an output sample rate of $2fs/M_2$.

3. The selectable bandwidth filter according to claim 1 further comprising a second analysis filter bank in communications with the channel selector so as to partition one of the M channels into multiple channels.

4. The selectable bandwidth filter according to claim 1 wherein the channel selector outputs selected portions of the M channels so as to generate an adjustable bandwidth output.

* * * * *